United States Patent
Suryanarayana et al.

(10) Patent No.: US 11,334,436 B2
(45) Date of Patent: May 17, 2022

(54) GPU-BASED ADVANCED MEMORY DIAGNOSTICS OVER DYNAMIC MEMORY REGIONS FOR FASTER AND EFFICIENT DIAGNOSTICS

(71) Applicant: Dell Products L.P., Round Rock, TX (US)

(72) Inventors: Shekar Babu Suryanarayana, Bangalore (IN); Balasingh Ponraj Samuel, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 401 days.

(21) Appl. No.: 16/540,369

(22) Filed: Aug. 14, 2019

(65) Prior Publication Data

US 2021/0049071 A1 Feb. 18, 2021

(51) Int. Cl.
*G06F 11/22* (2006.01)
*G06F 11/14* (2006.01)
*G06F 11/10* (2006.01)
*G06F 11/36* (2006.01)
*G11C 29/08* (2006.01)
*G11C 29/04* (2006.01)

(52) U.S. Cl.
CPC ...... *G06F 11/1417* (2013.01); *G06F 11/1016* (2013.01); *G06F 11/2284* (2013.01); *G06F 11/3688* (2013.01); *G11C 29/08* (2013.01); *G11C 2029/0407* (2013.01)

(58) Field of Classification Search
CPC .. G06F 11/22; G06F 11/2205; G06F 11/2284; G06F 11/273; G06F 11/2736; G11C 99/00; G11C 29/08; G11C 29/04; G11C 29/0407; G11C 29/52; G11C 29/48; G11C 29/56; G11C 29/56016; G11C 29/5602; G11C 2029/0407
See application file for complete search history.

(56) References Cited

U.S. PATENT DOCUMENTS 6,336,185 B1 * 1/2002 Sargenti, Jr ........... G06F 9/4405
713/1
10,553,290 B1 * 2/2020 Muchherla .......... G06F 11/1048
(Continued)

OTHER PUBLICATIONS

Intel Threat Detection Technology Uses GPU To Speed Up Antivirus by Leon Chan published by Tomshardware.com Apr. 18, 2018 https://www.tomshardware.com/news/intel-threat-detection-technology-tdt-gpu-offloading,36911.html#xenforo-comments-3280288 (Year: 2018).*

(Continued)

*Primary Examiner* — Joseph O Schell
(74) *Attorney, Agent, or Firm* — Jackson Walker L.L.P.

(57) ABSTRACT

An information handling system may include a central processing unit (CPU), a graphics processing unit (GPU) including a plurality of processing cores, a memory coupled to the CPU and to the GPU, and a basic input/output system (BIOS). While the information handling system is in a pre-boot environment and prior to initialization of an operating system of the information handling system, the BIOS may cause the central processing unit to select respective portions of the memory for failure testing; and cause individual ones of the plurality of processing cores of the GPU to carry out the failure testing of the respective portions of the memory.

20 Claims, 2 Drawing Sheets

(56) References Cited

U.S. PATENT DOCUMENTS

| | | | | |
|---|---|---|---|---|
| 2008/0077774 | A1* | 3/2008 | Cool | G06F 15/177 712/212 |
| 2012/0254602 | A1* | 10/2012 | Bhansali | G06F 9/4406 713/2 |
| 2016/0155514 | A1* | 6/2016 | Lai | G11C 29/76 714/723 |
| 2018/0218778 | A1* | 8/2018 | Chakraborty | G11C 29/44 |
| 2020/0097211 | A1* | 3/2020 | Alsasua | G06F 3/0659 |

OTHER PUBLICATIONS

Wikipedia's Intel Graphics Technology historical version published Aug. 9, 2019 https://en.wikipedia.org/w/index.php?title=Intel_Graphics_Technology&oldid=910041962 (Year: 2019).*

Wikipedia's Graphics Processing Unit historical version published Aug. 5, 2019 https://en.wikipedia.org/w/index.php?title=Graphics_processing_unit&oldid=909414888 (Year: 2019).*

Wikipedia's Multi-core Processor historical version published Aug. 9, 2019 https://en.wikipedia.org/w/index.php?title=Multi-core_processor&oldid=910054541 (Year: 2019).*

\* cited by examiner

GPU-BASED ADVANCED MEMORY DIAGNOSTICS OVER DYNAMIC MEMORY REGIONS FOR FASTER AND EFFICIENT DIAGNOSTICS

TECHNICAL FIELD

The present disclosure relates in general to information handling systems, and more particularly to systems and methods for efficiently performing memory diagnostics.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some methods already exist for performing memory diagnostics in a pre-boot environment such as a Basic Input/Output System (BIOS) (e.g., a Unified Extensible Firmware Interface (UEFI) BIOS). For example, memory "healing" technology may be used to test memory and detect failures. Then, upon a subsequent boot, bad portions of memory may be marked as unusable and not reported to an operating system, which may then not use them.

However, there are various deficiencies associated with such existing methods. For example, even with a modern, high-performance CPU, pre-boot memory diagnostics are performed serially because a UEFI BIOS is generally implemented in a single-threaded fashion.

Further, memory diagnostics are generally only run when a user explicitly decides to execute a diagnostic tool. That is, because of the length of time required by diagnostics, they are typically not run at every boot. Further, the fact that a second reboot is needed to mark the bad portions of memory as unusable requires even more time.

As memory sizes increase, more and more time is required for performing memory diagnostics at boot-time (e.g., during the pre-EFI initialization (PEI) phase). For example, a platform having 32 GB of memory might take a length of time that most users would deem unacceptable.

There is no existing method to make use of a graphics processing unit (GPU) for memory scanning in the pre-boot environment. Even though a GPU is extremely capable at parallel workloads, most GPUs remain idle during the pre-boot phase.

Accordingly, some embodiments of this disclosure use the parallel processing capabilities of a GPU to perform efficient memory scanning during the pre-boot phase.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with performing memory diagnostics in information handling systems may be reduced or eliminated.

In accordance with embodiments of the present disclosure, an information handling system may include a central processing unit (CPU), a graphics processing unit (GPU) including a plurality of processing cores, a memory coupled to the CPU and to the GPU, and a basic input/output system (BIOS). While the information handling system is in a pre-boot environment and prior to initialization of an operating system of the information handling system, the BIOS may cause the central processing unit to select respective portions of the memory for failure testing; and cause individual ones of the plurality of processing cores of the GPU to carry out the failure testing of the respective portions of the memory.

In accordance with these and other embodiments of the present disclosure, a method may include, while an information handling system is in a pre-boot environment and prior to initialization of an operating system of the information handling system: a basic input/output system (BIOS) of the information handling system causing a central processing unit (CPU) of the information handling system to select respective portions of a memory for failure testing; and the BIOS causing individual ones of a plurality of processing cores of a graphics processing unit (GPU) of the information handling system to carry out the failure testing of the respective portions of the memory.

In accordance with these and other embodiments of the present disclosure, an article of manufacture may include a non-transitory, computer-readable medium having computer-executable code thereon that is executable by an information handling system for, while the information handling system is in a pre-boot environment and prior to initialization of an operating system of the information handling system: a basic input/output system (BIOS) of the information handling system causing a central processing unit (CPU) of the information handling system to select respective portions of a memory for failure testing; and the BIOS causing individual ones of a plurality of processing cores of a graphics processing unit (GPU) of the information handling system to carry out the failure testing of the respective portions of the memory.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
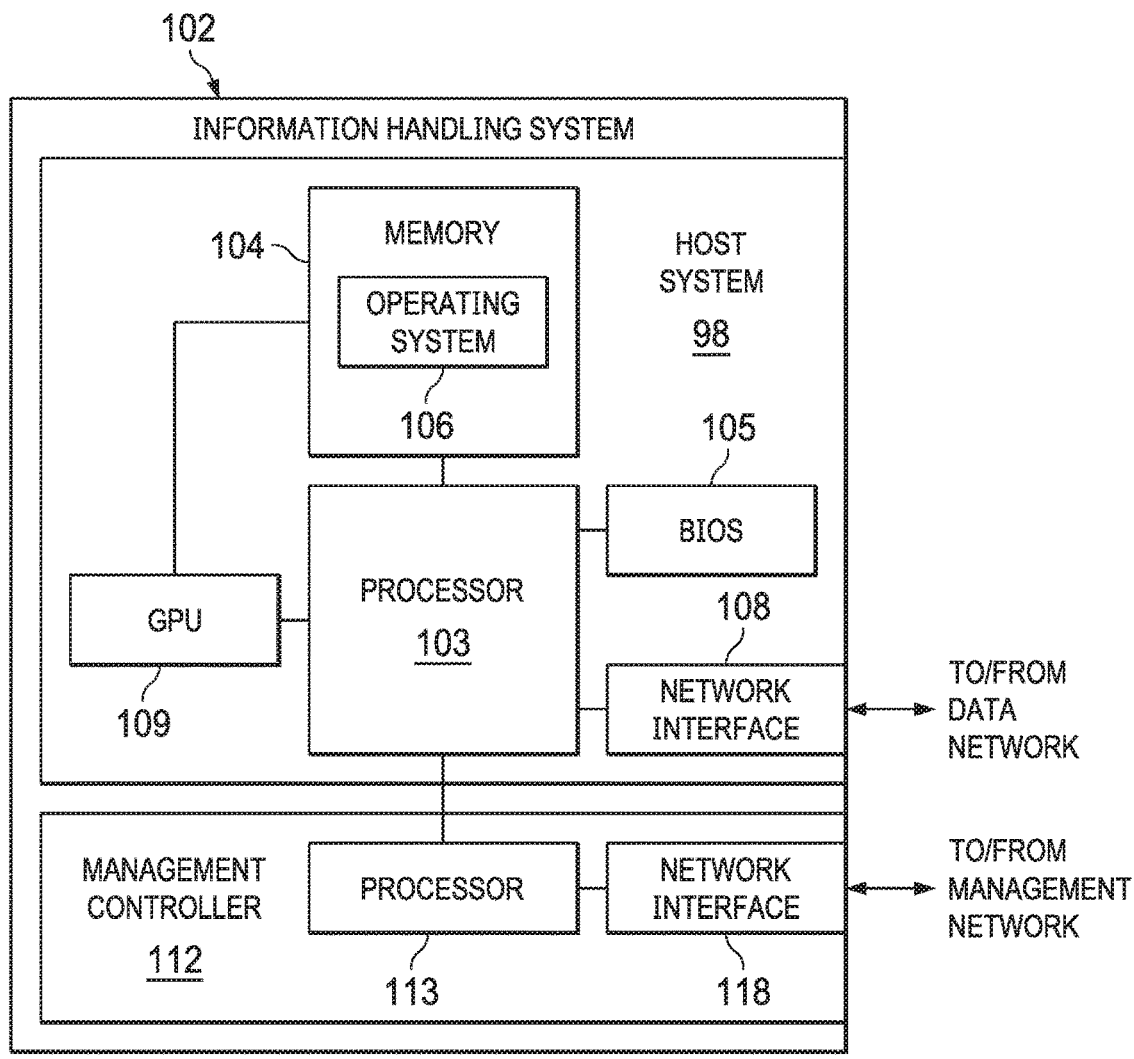
FIG. 1 illustrates a block diagram of an example information handling system, in accordance with embodiments of the present disclosure.
Figure 3:
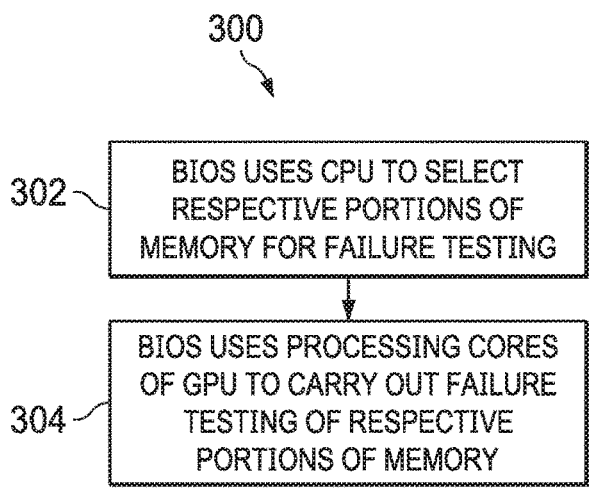
FIG. 3 illustrates an example flow diagram, in accordance with embodiments of the present disclosure.
Figure 2:
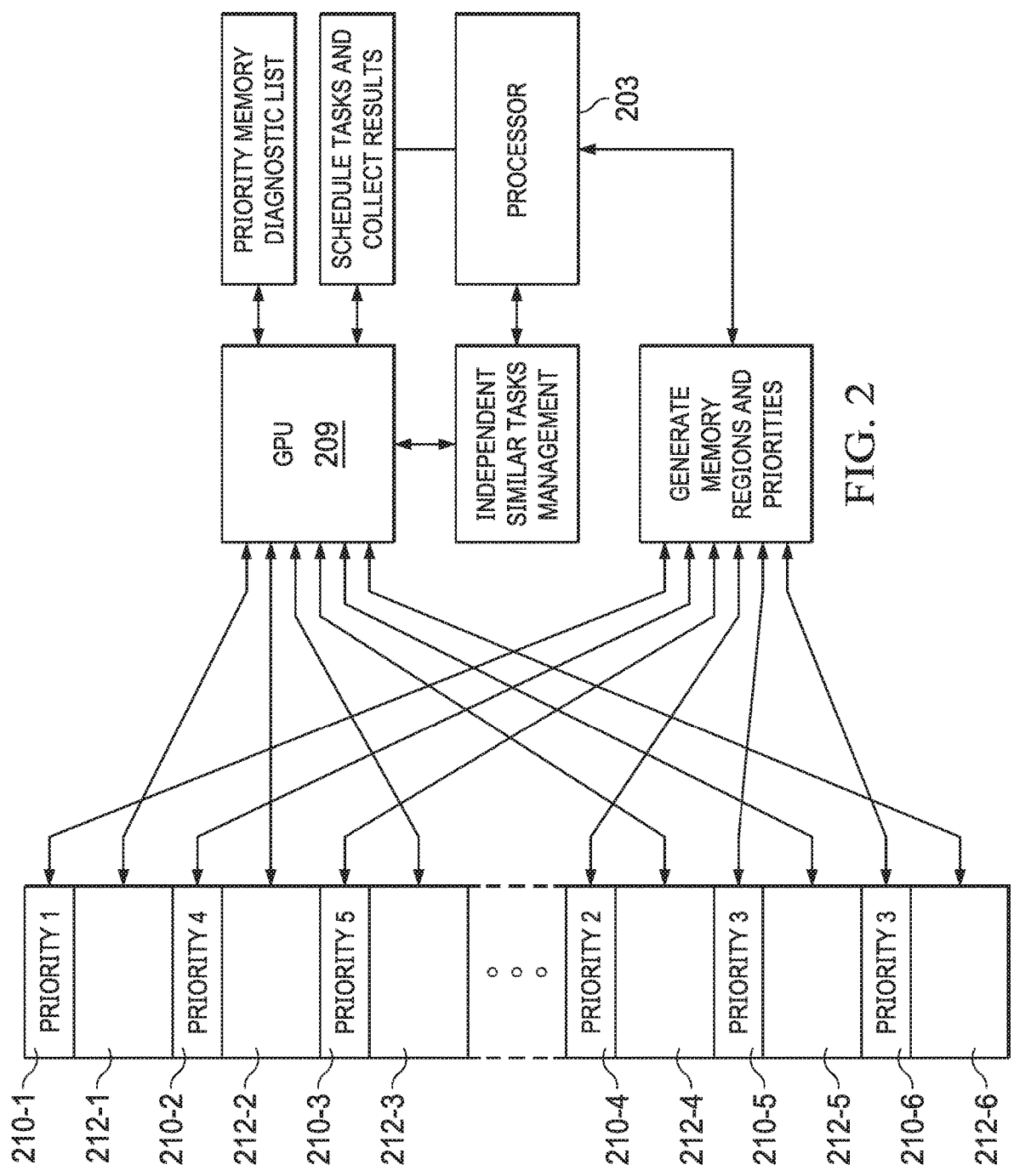
FIG. 2 illustrates a block diagram of an example architecture, in accordance with embodiments of the present disclosure.

Preferred embodiments and their advantages are best understood by reference to FIGS. 1 through 3, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, the term "management controller" may broadly refer to an information handling system that provides management functionality (typically out-of-band management functionality) to one or more other information handling systems. In some embodiments, a management controller may be (or may be an integral part of) a service processor, a baseboard management controller (BMC), a chassis management controller (CMC), or a remote access controller (e.g., a Dell Remote Access Controller (DRAC) or Integrated Dell Remote Access Controller (iDRAC)).

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103, and a management controller 112 communicatively coupled to processor 103.

In operation, processor 103, memory 104, BIOS 105, and network interface 108 may comprise at least a portion of a host system 98 of information handling system 102. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

In some embodiments, processor 103 may be a central processing unit (CPU) of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Management controller 112 may be configured to provide management functionality for the management of information handling system 102. Such management may be made by management controller 112 even if information handling system 102 and/or host system 98 are powered off or powered to a standby state. Management controller 112 may include a processor 113, memory, and a network interface 118 separate from and physically isolated from network interface 108.

As shown in FIG. 1, processor 113 of management controller 112 may be communicatively coupled to processor 103. Such coupling may be via a Universal Serial Bus (USB), System Management Bus (SMBus), and/or one or more other communications channels.

Network interface 118 may be coupled to a management network, which may be separate from and physically isolated from the data network as shown. Network interface 118 of management controller 112 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC." Network interface 118 may be the same type of device as network interface 108, or in other embodiments it may be a device of a different type.

Information handling system 102 may also include one or more graphics processing units (GPUs) 109 coupled to processor 103 and to memory 104. GPU 109 may include any system, device, or apparatus configured to perform graphics processing tasks. Typically, such a GPU may include a large number of processing cores and may also be well-suited for some types of parallel processing tasks other than graphics processing. As discussed in further detail below, embodiments of this disclosure may leverage the parallel processing abilities of GPU 109 in performing efficient memory diagnostics.

Embodiments of this disclosure may implement an advanced memory diagnostics module that executes in a pre-boot environment. This memory diagnostics module may dynamically create memory regions and share these memory regions between a CPU and a GPU to perform memory diagnostics independently.

The system BIOS (e.g., running on the main CPU) may offload memory diagnostics to processing units of the GPU, and it may also perform memory diagnostics on every boot instead of just when requested by a user. During execution of the pre-boot environment, the system BIOS may intelligently prioritize memory regions based on memory usage and/or based on statistics from previous memory testing. For example, regions of memory that tend to be used more may be assigned a higher priority. Further, regions that have been scanned recently may be assigned a low priority.

By employing this intelligent prioritization and using the GPU to test the memory, memory diagnostics may be performed on every boot. This process allows for proactively healing memory blocks without adding any significant amount of additional boot time. In some embodiments, memory regions may be prioritized such that only a subset of memory (e.g., the subset with the highest priority for being diagnosed) is scanned on any given boot. Thus over a period of time including multiple boots, the entirety of memory may eventually be scanned with minimal impact on system performance and boot time. In some embodiments, a user may determine how much memory should be scanned on each boot. For example, a user might decide that scanning 2 GB per boot is a reasonable tradeoff between providing good coverage and not having the boot process take overly long. In other embodiments, a user may be able to specify a percentage of memory to scan on each boot (e.g., 25%, 12.5%, etc.). Further, in some embodiments, memory scanning may even take place when an information handling system resumes from hibernation, etc.

Turning now to FIG. 2, a block diagram of an example architecture is shown. In operation, processor 203 (which may be a CPU or a core of a CPU) coordinates with GPU 209 (or individual cores of GPU 209) to perform memory diagnostics.

A boot service executed by processor 203 during the PEI phase may initialize GPU 209 and enumerate the device path of GPU 209 as available for UEFI event-based "Independent Similar Task Execution" (ISTE). ISTE may utilize UEFI boot services-based task priority services, events, and timers to create a similar task that can run independently, on processing cores of GPU 209 as well as CPU 203. In existing solutions, during the pre-boot phase, the GPU typically is idle the whole time; accordingly, embodiments of this disclosure may allow for greater utilization of existing resources. A GPU, when compared to a CPU, is typically more efficient in terms of parallel execution of tasks, especially if the tasks are memory-bound.

The ISTE discussed above may be implemented via two (or more) modules. The first module, a Dynamic Memory Region Creation module, may implement a Memory Initialization Table (MIT), read the available system memory size and number of banks in the system from memory device properties, and populate the MIT.

One of ordinary skill in the art with the benefit of this disclosure will understand various criteria that may be used to create memory regions. Some example criteria may include previous memory test statistics (e.g., aggregated by the system BIOS), as well as memory usage statistics (e.g., collected by a software agent running under the operating system, which may transmit the usage statistics to the system BIOS).

As shown in FIG. 2, processor 203 may generate memory regions and their respective priorities to arrive at a set of memory regions 212 (e.g., memory regions 212-1 through 212-6). Each memory region 212 may have a record 210 associated therewith to indicate that region's priority and any other relevant information. For example, record 210-1 indicates that memory region 212-1 currently has the highest priority for being scanned. This may be the case, for example, because it has been a long time since memory region 212-1 has been scanned. In other embodiments, it may be because memory region 212-1 was particularly heavily used by the operating system during the previous boot session, etc.

The memory region records 210 may be added to the MIT queue. ISTE status and execution block information may then be tracked by processor 203.

Another ISTE module may be an Independent Similar Tasks Management module, which may create tasks that can do a similar job (e.g., memory diagnostics) by setting task priority level and creating dynamic events based on the scheduled timer. Independent tasks may be created (e.g., via a callback function that executes assembly code to read the memory region header and execute the memory diagnostics algorithm in that memory region). The task may then be considered a series of very simple execution jobs. Thus there may be no need to perform I/O or wait for events, interrupts, etc. Each task may run a set of memory-bound instructions such as a memory exerciser. Once a task has completed executing, it may return its status by updating the MIT queue.

Processor 203 may collect the results of the various tasks executed by GPU 209 and determine which regions of memory (if any) are experiencing failures.

Thus processing cores of the GPU may run diagnostics on each memory region independently of the regular BIOS pre-boot phase that is being concurrently executed by the main CPU. When the BIOS is ready to boot, but before an operating system has been initialized, the BIOS may determine whether any failures have occurred (e.g., by investigating the MIT queue for any memory failures). This technique thus allows the memory to be healed (e.g., by not reporting the failed regions to the operating system) on the same boot that the failures are detected, without requiring an additional reboot. Further, this process may be carried out on every boot without any interaction from the end user.

Turning now to FIG. 3, a flow diagram of an example method for performing memory diagnostics is shown, in accordance with some embodiments of this disclosure.

At step 302, the BIOS of an information handling system may select respective portions of memory for failure testing. This step may be carried out via a CPU or a particular core of a CPU in some embodiments. In some cases, the BIOS may select portions that comprise less than the totality of system memory. In other cases, the BIOS may select portions that comprise all of the system memory. These selected portions of memory may also be prioritized based on various criteria. For example, although on any given system boot only a portion of memory may be scanned, the prioritization may ensure that over the course of several boots (and several corresponding memory scans) all of the available memory eventually gets scanned. For example, the BIOS may select a suitable percentage (e.g., 25%) of memory to scan on any particular boot.

At step 304, the BIOS may carry out failure testing of the selected portions of memory. This step may be carried out via a plurality of parallel tasks executing concurrently on various processing cores of a GPU.

One of ordinary skill in the art with the benefit of this disclosure will understand that the preferred initialization point for the method depicted in FIG. 3 and the order of the steps comprising that method may depend on the implementation chosen. In these and other embodiments, this method may be implemented as hardware, firmware, software, applications, functions, libraries, or other instructions. Further, although FIG. 3 discloses a particular number of steps to be taken with respect to the disclosed method, the method may be executed with greater or fewer steps than those depicted. The method may be implemented using any of the various components disclosed herein (such as the components of FIG. 1), and/or any other system operable to implement the method.

Accordingly, various embodiments of this disclosure may provide many benefits. For example, in some embodiments, advanced memory diagnostics may utilize one or more CPU cores as well as cores of a GPU to perform parallel memory diagnostics over system memory. Further, creation of memory regions based on test statistics and/or memory usage patterns may provide additional benefits. Still further, the use of Independent Similar Task Execution may enable the pre-boot mode to run similar parallel tasks such as memory scanning to provide improved performance in the pre-boot memory diagnostics.

Although various possible advantages have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
   a central processing unit (CPU);
   a graphics processing unit (GPU) comprising a plurality of processing cores;
   a memory coupled to the CPU and to the GPU; and
   a basic input/output system (BIOS) configured to, while the information handling system is in a pre-boot environment and prior to initialization of an operating system of the information handling system:
      cause the CPU to select respective portions of the memory for failure testing; and
      cause individual ones of the plurality of processing cores of the GPU to carry out the failure testing of the respective portions of the memory;
   wherein, during each particular boot of a plurality of boots of the information handling system, the failure testing is carried out on only a particular subset of the memory, and wherein the respective portions of the memory are selected such that, over the plurality of boots of the information handling system, the failure testing is carried out on an entirety of the memory.

2. The information handling system of claim 1, wherein the BIOS is a Unified Extensible Firmware Interface (UEFI) BIOS.

3. The information handling system of claim 1, wherein the BIOS is further configured to:
   detect a particular portion of the memory that has failed; and
   mark the particular portion of the memory such that the operating system is configured to initialize without using the particular portion of the memory.

4. The information handling system of claim 3, wherein the initialization of the operating system is configured to occur without an additional reboot of the information handling system.

5. The information handling system of claim 1, wherein the individual ones of the plurality of processing cores of the GPU are configured to carry out the failure testing of the respective portions of the memory concurrently.

6. The information handling system of claim 1, wherein the selection of the respective portions of the memory for failure testing is based at least in part on usage statistics for the memory.

7. The information handling system of claim 1, wherein the selection of the respective portions of the memory for failure testing is based at least in part on statistics for prior failure tests of the memory.

8. The information handling system of claim 1, wherein the BIOS is configured to carry out the selecting and the failure testing on every boot of the information handling system.

9. A method comprising:
   while an information handling system is in a pre-boot environment and prior to initialization of an operating system of the information handling system:
      a basic input/output system (BIOS) of the information handling system causing a central processing unit (CPU) of the information handling system to select respective portions of a memory for failure testing; and
      the BIOS causing individual ones of a plurality of processing cores of a graphics processing unit (GPU) of the information handling system to carry out the failure testing of the respective portions of the memory;
   wherein, during each particular boot of a plurality of boots of the information handling system, the failure testing is carried out on only a particular subset of the memory, and wherein the respective portions of the memory are selected such that, over the plurality of boots of the information handling system, the failure testing is carried out on an entirety of the memory.

10. The method of claim 9, wherein the memory is random access memory (RAM).

11. The method of claim 9, wherein the CPU includes a plurality of cores, and wherein the selecting is carried out by a single one of the plurality of cores of the CPU.

12. The method of claim 9, wherein the selection of the respective portions of the memory for failure testing is based on usage statistics for the memory and on statistics for prior failure tests of the memory.

13. An article of manufacture comprising a non-transitory, computer-readable medium having computer-executable code thereon that is executable by an information handling system for, while the information handling system is in a pre-boot environment and prior to initialization of an operating system of the information handling system:
   a basic input/output system (BIOS) of the information handling system causing a central processing unit (CPU) of the information handling system to select respective portions of a memory for failure testing; and
   the BIOS causing individual ones of a plurality of processing cores of a graphics processing unit (GPU) of the information handling system to carry out the failure testing of the respective portions of the memory;
   wherein, during each particular boot of a plurality of boots of the information handling system, the failure testing is carried out on only a particular subset of the memory, and wherein the respective portions of the memory are selected such that, over the plurality of boots of the information handling system, the failure testing is carried out on an entirety of the memory.

14. The article of claim 13, wherein the BIOS is a Unified Extensible Firmware Interface (UEFI) BIOS.

15. The article of claim 13, wherein the code is further for:
   detecting a particular portion of the memory that has failed; and
   marking the particular portion of the memory such that the operating system is configured to initialize without using the particular portion of the memory.

16. The article of claim 15, wherein the initialization of the operating system is configured to occur without an additional reboot of the information handling system.

17. The article of claim 13, wherein the individual ones of the plurality of processing cores of the GPU are configured to carry out the failure testing of the respective portions of the memory concurrently.

18. The article of claim 13, wherein the selection of the respective portions of the memory for failure testing is based at least in part on usage statistics for the memory.

19. The article of claim 13, wherein the selection of the respective portions of the memory for failure testing is based at least in part on statistics for prior failure tests of the memory.

20. The article of claim 13, wherein the code is further for carrying out the selecting and the failure testing on every boot of the information handling system.

* * * * *